(12) United States Patent
Kikuchi et al.

(10) Patent No.: US 7,127,382 B2
(45) Date of Patent: Oct. 24, 2006

(54) APPARATUS AND METHOD FOR SIMULATING PRODUCTION WITH ELECTRONIC-COMPONENT MOUNTING APPARATUS

(75) Inventors: Akihiko Kikuchi, Fukuoka (JP); Kazuhiko Nakahara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 735 days.

(21) Appl. No.: 10/188,531

(22) Filed: Jul. 3, 2002

(65) Prior Publication Data

US 2003/0023418 A1   Jan. 30, 2003

(30) Foreign Application Priority Data

Jul. 6, 2001   (JP)   ............................. 2001-205857

(51) Int. Cl.
*G06G 7/48*   (2006.01)
(52) U.S. Cl. ............................. 703/6; 700/97
(58) Field of Classification Search .................. 703/6; 700/97
See application file for complete search history.

(56) References Cited

U.S. PATENT DOCUMENTS

| | | | | |
|---|---|---|---|---|
| 4,604,718 A | * | 8/1986 | Norman et al. ................ | 703/6 |
| 4,881,319 A | * | 11/1989 | Yagi et al. .................... | 29/840 |
| 5,086,556 A | * | 2/1992 | Toi ............................. | 29/740 |
| 5,155,679 A | * | 10/1992 | Jain et al. .................... | 700/106 |
| 5,177,864 A | * | 1/1993 | Oyama ........................ | 29/833 |
| 5,390,283 A | * | 2/1995 | Eshelman et al. ............ | 706/13 |
| 5,772,835 A | * | 6/1998 | Jordan et al. ................ | 156/358 |
| 5,910,894 A | * | 6/1999 | Pryor .......................... | 700/95 |
| 5,933,349 A | * | 8/1999 | Dalgleish et al. ........... | 700/121 |
| 6,000,123 A | * | 12/1999 | Munezane et al. ............ | 29/740 |
| 6,041,494 A | * | 3/2000 | Mimura et al. ............... | 29/832 |
| 6,230,393 B1 | * | 5/2001 | Hirano et al. ................. | 29/740 |
| 6,275,815 B1 | * | 8/2001 | Schaffer et al. .............. | 706/13 |
| 6,282,528 B1 | * | 8/2001 | Schaffer et al. .............. | 706/13 |
| 6,356,352 B1 | * | 3/2002 | Sumi et al. .................. | 356/614 |
| 6,487,544 B1 | * | 11/2002 | Eshelman et al. ............ | 706/13 |
| 6,650,953 B1 | * | 11/2003 | Schaffer et al. ............. | 700/103 |

FOREIGN PATENT DOCUMENTS

| | | |
|---|---|---|
| JP | 03-136754 | 6/1991 |
| JP | 10-229293 | 8/1998 |

OTHER PUBLICATIONS

TirpaK, Thomas M., "Simulation software for surface mount assembly", Proceedings of the 1993 Winter Simulation Conference.*

(Continued)

*Primary Examiner*—Paul Rodriguez
*Assistant Examiner*—Russ Guill
(74) *Attorney, Agent, or Firm*—RatnerPrestia

(57) ABSTRACT

An apparatus and method for production simulation simulates to calculate a total number of assembly boards manufactured with time by an electronic-component-mounting apparatus which includes a component feeding section having plural component feeders for feeding various components. The apparatus and the method allow a result of the simulation to be displayed. The production simulation apparatus is linked with a host computer for generating, transmitting, receiving, and storing data. When data for mounting components on a bare board is generated, production data for providing local maximum mounting efficiency is generated through carrying out an optimization process. The simulation for manufacturing the assembly boards is carried out using the production data and a production command data.

10 Claims, 7 Drawing Sheets

OTHER PUBLICATIONS

Yan et al., "Interactive, agent base, modeling and simulation of virtual manufacturing assemblies", ACM Library Database, 1998.*

Cholawsky, W.J., "A process database record system design for confectionery products", Program4 Engineering, Inc., Apr. 11, 2000.*

Kimberly P. Ellis et al.; "Optimizing the performance of a surface mount placement machine", Jul. 2001, IEEE Transactions on Electronics Packaging Manufacturing, vol. 24, No. 3.*

V. Jorge Leon et al.; "A comparison of setup strategies for printed circuit board assembly", 1998, Computers and Industrial Engineering, vol. 34, No. 1.*

Peter Csaszar et al; "Optimization of a high-speed placement machine using tabu search algorithms", 2000, Annals of Operations Research, vol. 96.*

Weihsin Wang et al.; "Optimization of high-speed multistation SMT Placement Machines using evolutionary algorithms", Apr. 1999, IEEE Transactions on Electronics Packaging Manufacturing, vol. 22, No. 2.*

J. Smed et al.; "An Interactive System for scheduling jobs in electronic assembly", 2000, International Journal of Advanced Manufacturing Technology, vol. 16.*

L. F. McGinnis et al.; "Automated process planning for printed circuit card assembly", Sep. 1992, IIE Transactions, vol. 24, No. 4.*

* cited by examiner

APPARATUS AND METHOD FOR SIMULATING PRODUCTION WITH ELECTRONIC-COMPONENT MOUNTING APPARATUS

CROSS-REFERENCE TO RELATED APPLICATION

This application is based upon and claims benefit of priority of Japanese Patent Application No. 2001-205857 filed on Jul. 6, 2001, the contents of which are incorporated herein by reference.

FIELD OF THE INVENTION

The present invention relates to an apparatus and method for simulating production of assembly boards with an electronic component mounting apparatus.

BACKGROUND OF THE INVENTION

An electronic-component-mounting line used in production of assembly boards including components mounted thereon is commonly of a general-use type and may be utilized for producing many types of assembly boards. Including a mounting mechanism significantly improved in quality and function, the electronic-component-mounting line accordingly operates in a so-called "continuously-shifting" mode for mounting the components onto different types of bare boards not with a change of its component feeders along the mounting line but with a change of control data.

The continuously-shifting mode is however disadvantageous to an improvement in productivity. The mode, since allowing the component feeders to be fixedly located in the line, may hardly be optimum in the productivity when different types of products are manufactured. It is difficult to appropriately determine which order the different bare boards are put in the line and when the component feeders are changed. Steps of the production can not be evaluated in view of the productivity, and this prevents the productivity from being improved.

SUMMARY OF THE INVENTION

A production simulation apparatus includes a data storage unit, a production data generator, a command inputting unit, a production simulator, and a display unit. The data storage unit stores mounting data about plural types of assembly boards and apparatus data about a component-mounting apparatus which includes: plural component feeders for feeding components; and a transfer head for picking up the components from the component feeders and mounting the components on bare boards. The production data generator generates, according to the mounting data and the apparatus data, production data for the transfer head to mount the components. The command inputting unit inputs production command data including a production quantity of the assembly boards and a production order of the assembly boards to be manufactured. The production simulator simulates a production based on the production data and the production command data to calculate a total number of the assembly boards manufactured with time by the component-mounting apparatus. The display unit displays a result of the simulation.

The apparatus can simulate production for evaluating production plan.

DESCRIPTION OF THE PREFERRED EMBODIMENT

Figure 1:
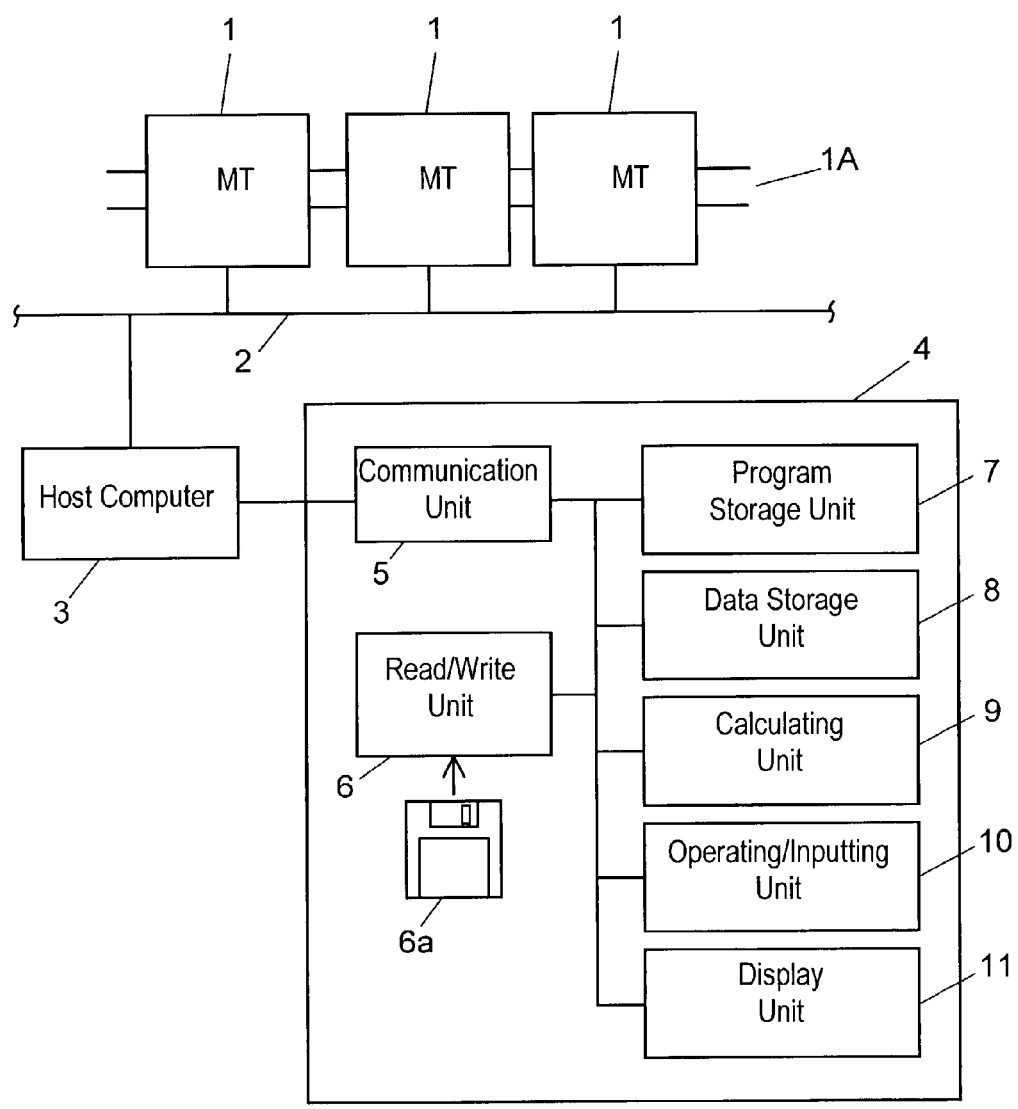
FIG. 1 is a block diagram of a production simulation apparatus of an electronic-component-mounting apparatus according to an embodiment of the present invention.

In FIG. 1, plural electronic-component-mounting apparatuses 1 are aligned along an electronic-component-mounting line 1A and connected on a local area network (LAN) 2 to a host computer 3. The host computer 3 is connected to a production simulation apparatus 4. The production simulation apparatus 4 simulates production to indicate progress of the production as digital data, upon being provided with types or lots of bare boards put in the electronic-component-mounting line.

The production simulation apparatus 4, similarly to a common personal computer, includes a communication unit 5, a read/write unit 6, a program storage unit 7, a data storage unit 8, a calculating unit 9, an operating/inputting unit 10, and a display unit 11. The communication unit 5 exchanges data with the host computer 3. The read/write unit 6 reads and writes data in an external storage medium such as FD or CD-R. The program storage unit 7 stores a production-data-generating program, an optimum-calculating program, a production-simulating program, and other operating programs, which will be described later in more detail.

The data storage unit 8 stores data including apparatus data about the electronic-component-mounting apparatuses 1, and mounting data about the assembly boards to be manufactured. The calculating unit 9 is a central processing unit (CPU) for executing the operation programs stored in the program storage unit 7 to compute and process with the data stored in the data storage unit 8. The operating/inputting unit 10 is a keyboard or a mouse for inputting data and commands of operation. The display unit 11 is a monitor for displaying menu screens for the operation and inputting operation and graphic images of the result of production simulations.

Figure 2:
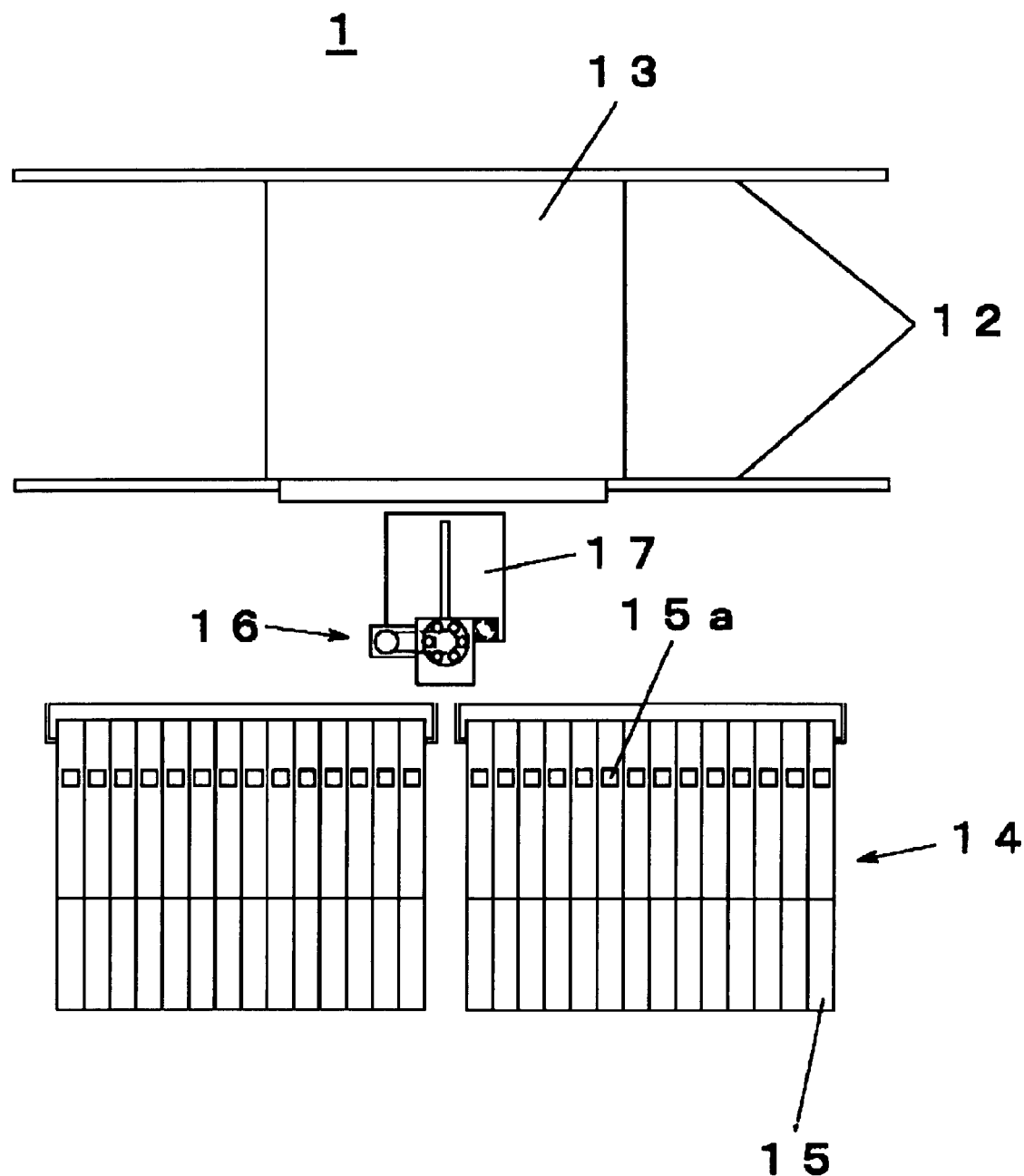
FIG. 2 is a plan view of a primary part of the electronic-component-mounting apparatus according to the embodiment.

The electronic-component-mounting apparatus 1 will be described in more detail referring to FIG. 2. As shown in FIG. 2, the apparatus 1 includes a conveying path 12. Bare Boards 13 are conveyed along the conveying path 12 to locate it at a location for mounting each electronic component. A component-feeding section 14 is provided at a side of the conveying path 12. The component-feeding section 14 includes component feeders 15. The feeders 15 includes plural types of feeders, for example, a feeder for storing electronic components held with a tape and feeding the components through forwarding the tape by a pitch, and a vibration feeder for feeding electronic components by vibration from a stick holding the components therein.

The electronic components mounting apparatus 1 also includes a transfer head 16. The head 16 driven with a head driving mechanism (not shown) picks up components from pick-up location 15a of the component feeder 15. A camera 17 for identifying components is provided between the conveying path 12 and the component-feeding section 14. The component picked up by the transfer head 16 is carried from the component-feeding section 14 to the camera 17 for identifying the component. The transfer head 16 then moves to over the bare board 13 and mounts the component to the board 13.

The production data for driving the electronic-component-mounting apparatus 1 to manufacture assembly boards will be explained. Design information for a product (an assembly board to be manufactured) indicating locations where the components are mounted on the bare boards 13 is provided as mounting data. Apparatus information about the apparatus for manufacturing the assembly boards is provided. The apparatus data determines a location where the bare boards 13 are paused, the location of each unit such as a feeder table (not shown) for supplying the electronic components, and the arrangement of the transfer head 16 (including the number of heads and the shape and the number of nozzles).

The mounting data and the apparatus data are combined to generate production data. Based on the production data, mounting sequence data are provided. The sequence data determines types, the number, and locations of the component feeders 15 at the feeder table and a sequence of picking up the electronic component from the component feeder 15 by a suction operation of the transfer head 16 to mount it to the bare board. The electronic-component-mounting apparatus 1 operates with the production data and the mounting sequence data, and thus manufactures the assembly boards having components mounted thereon specified by the design information (the mounting data).

The production data is optimized so that the transfer head 16 can pick up and mount the components on the bare boards 13 most efficiently under a given condition. If the positions of the feeders or the mounting sequence data is inadequate for manufacturing the assembly boards with one mounting data, the transfer head 16 may repeat to move unnecessarily and take more time to mount the components on the bare board 13 less efficiently. The positions of the feeders and the mounting sequence data are calculated so as to minimize the time required for the mounting operation of the transfer head.

For the optimization, the most optimum combination is preferably selected from possible combinations (the feeders and the sequence of mounting operations) including the arrangement of the feeders and the mounting sequence as variable parameters for maximum efficiency. However, such a preferable manner may decline an overall working efficiency in practice. Electronic-component-mounting apparatuses, since being generally designed and used for manufacturing different types of assembly boards, need to have their procedure modified at every time when the assembly board to be manufactured changes to a new type. The modification involves not only different manipulations on an operation panel but also replacement or relocation of the component feeders as well. The maximum efficiency has to be determined based on not only the efficiency of mounting actions but also the overall working efficiency in conjunction with the modification of procedure and arrangement.

The modification of the procedure and arrangement including the relocation of the feeders is desirably minimized whenever the assembly board to be manufactured changes to a new type. This can be implemented through locating all or some of the feeders at their fixed locations and calculating optimum conditions based on the fixed location as a fixed condition (the premises). The optimum conditions calculated with the premises allow an operator and time required for replacement or relocation of the component feeders to be minimized, thus improving the overall working efficiency.

Feeder arrangement data in the production data for determining the location of the feeders in the component-feeding section 14 will be explained. When the assembly board to be manufactured changes to a new type, the arrangement of the component feeders 15 in the component-feeding section 14 is modified according to the type of the assembly board. That is, required number of component feeders 15 are prepared for feeding components depending on the type of the assembly board.

The arrangement of the component feeders has to be determined not only in types and the number of the feeders corresponding to the components to be mounted, but also in the locations of the component feeders 15 in the component-feeding section 14. In the mounting operation, the transfer head 16 moves forward and backward between the component-feeding section 14 and the bare board 13 to repeat a mounting operation of picking up the electronic components from the component feeder 15 and mounting it to the bare board 13. The operating efficiency of the transfer head 16 hence depends largely upon whether the location of the component feeder 15 is suitable to a mounting sequence movement in the component feeding section 14. The position of the component feeders 15 is determined for optimizing the mounting operation of the transfer head 16.

Figure 3:
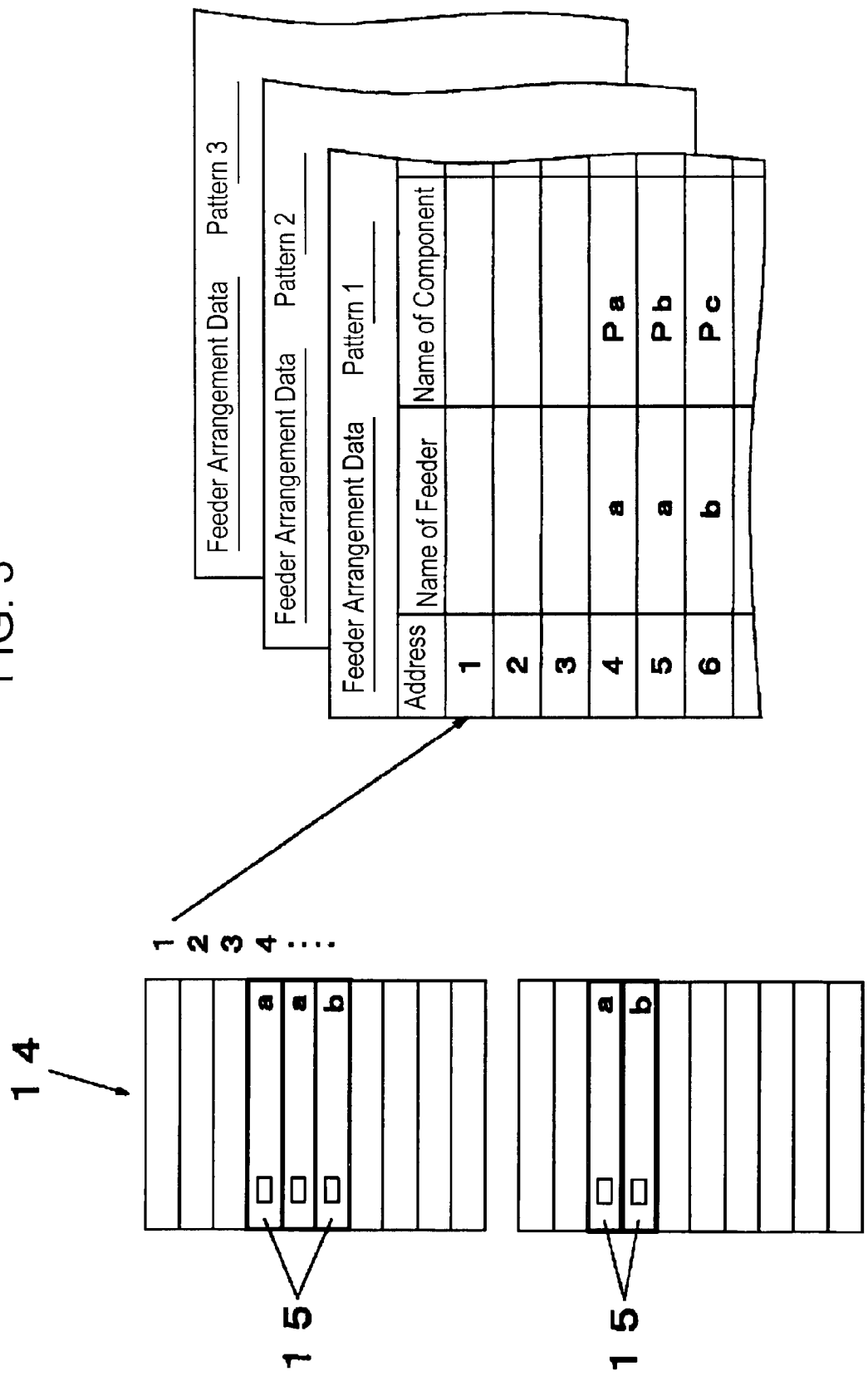
FIG. 3 illustrates a feeder arrangement data according to the embodiment.

The feeder arrangement data is provided as a data table as shown in FIG. 3. The data table includes columns corresponding to respective addresses in the feeder table of the component-feeding section 14. The columns include respective names (a, b, . . . ) identifying component feeders 15, names (Pa, Pb, . . . ) of the components, and other relevant information if necessary. The names in the data table secures the component feeders 15 at their fixed location in the component feeding section 14. The feeder arrangement data determines several patterns (pattern 1, 2, 3, . . . ) of the locations of the component feeders 15. Determining the pattern determines the arrangement of the component feeders 15 in different manners. According to one pattern which can arbitrarily be selected, the component feeders 15 in the components supply section 14 are arranged uniformly. The feeder arrangement data in this embodiment may be selected from predetermined patterns which will be explained later or may be generated as a unique pattern through specifying data such as the name of the feeder.

Figure 4:
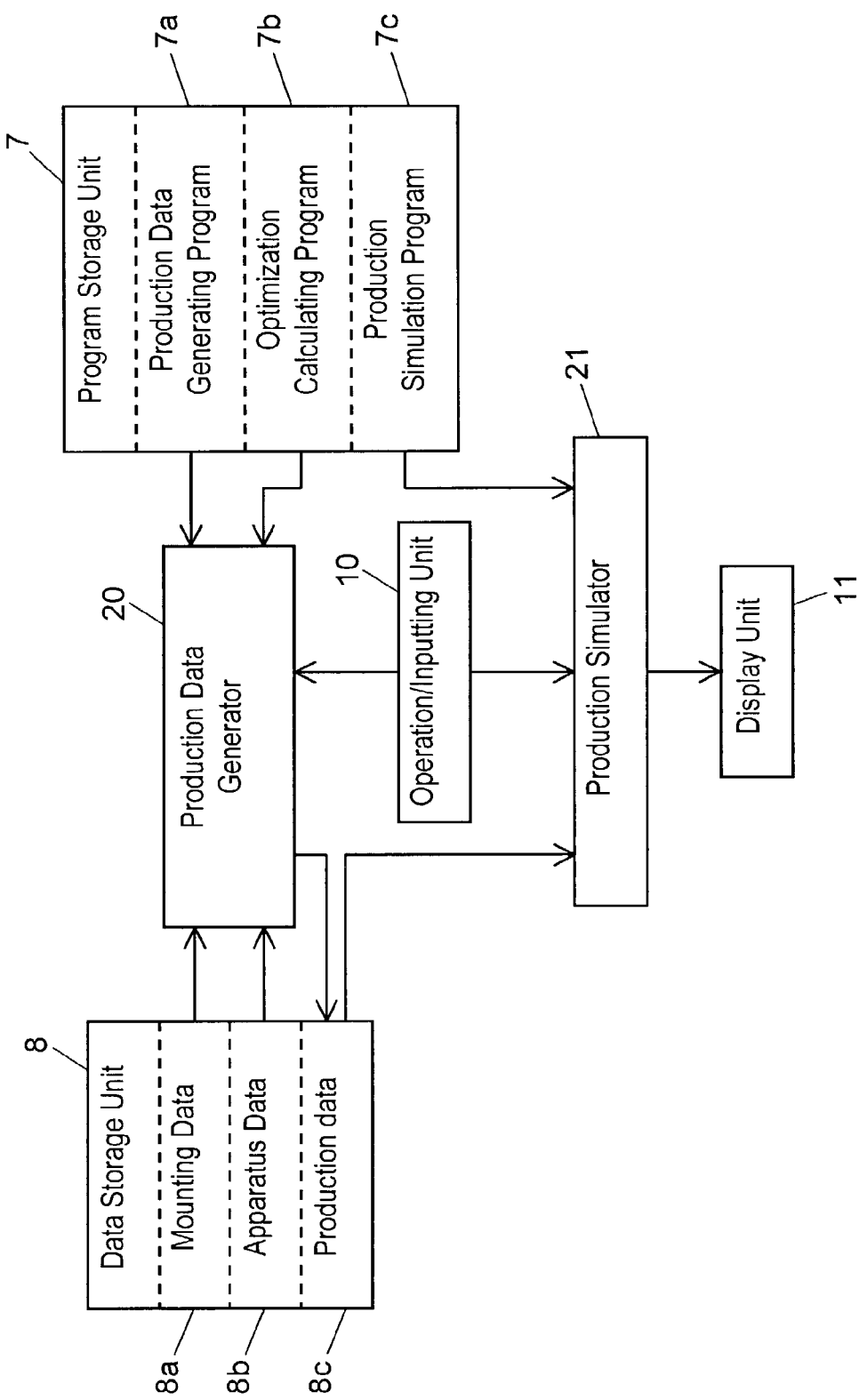
FIG. 4 is a functional block diagram of the production simulation apparatus of the electronic-component-mounting apparatus according to the embodiment.

Functions of the production simulation apparatus 4 will be described referring to FIG. 4. A production data generator 20 and a production simulator 21 indicate process functions conducted by the process programs stored in the program storage unit 7.

Data stored in the data storage unit 8 (data storage means) will be described. The mounting data 8a carries characteristic information of each of assembly boards 13 to be manufactured including mounting coordinates and a type of component at each coordinates. The apparatus data 8b carries characteristic information of the electronic-component-mounting apparatus 1 including the feeder data. The feeder data carries information of each component feeder 15 including compatibility with the component (between the component feeder and a component feeder holder) and the compatibility (with the component feeder holder) in the component feeding section 14.

Programs stored in the program storage unit 7 will be described. A production data generating program 7a is provided for generating production data from a combination of the mounting data and the apparatus data. The production data includes the feeder arrangement data and the mounting sequence data for driving the transfer head 16 to execute a mounting operation. An optimization calculating program 7b is provided for calculating to optimize the efficiency of the mounting operation of the transfer head 16 and for determining how the transfer head 16 operates.

A production simulation program 7c is provided for simulating a procedure of the electronic-component-mounting apparatus manufacturing a time based total number of the assembly boards from the production data and a production command data including the number of the assembly boards of each type and the order of the types to be manufactured.

The production data generator 20 produces production data from the mounting data 8a and the apparatus data 8b according to the production data generating program 7a. In this operation, the optimization calculating program 7b conducts to determine an optimum operation of the transfer head 16. While the production data generator 20 operates as production data generating means, the production data 8c is stored in the data storage unit 8.

The production simulator 21 executes the production simulation program 7c using the production data 8c for simulating a production process. That is, since the production data 8c contains all essential information about the operation of the transfer head 16 such as the feeder arrangement data and the mounting sequence data, a cycle time for the assembly boards to be manufactured can be calculated from the production data 8c. Based on the cycle time, the number of the assembly boards manufactured by the electronic-component-mounting apparatus can be calculated.

In prior to the production simulation, the production command data including the number of assembly boards of each type and the order of the types to be manufactured is input through the operating/inputting unit 10. The operating/inputting unit 10 is command input means for inputting production commands while the production simulation unit 21 is production simulating means.

In the production simulation, a load for working required for shifting a stage switched from one type of assembly board to be manufactured to another through inputting a command for the order of production can be calculated as digital data, e.g. the number of the feeders to be replaced or relocated. The digital data is then used for determining the time of the stage shifting needed for modifying the stage. The result of the simulation is visually displayed on a monitor of the display unit 11, which operates as displaying means.

Figure 5:
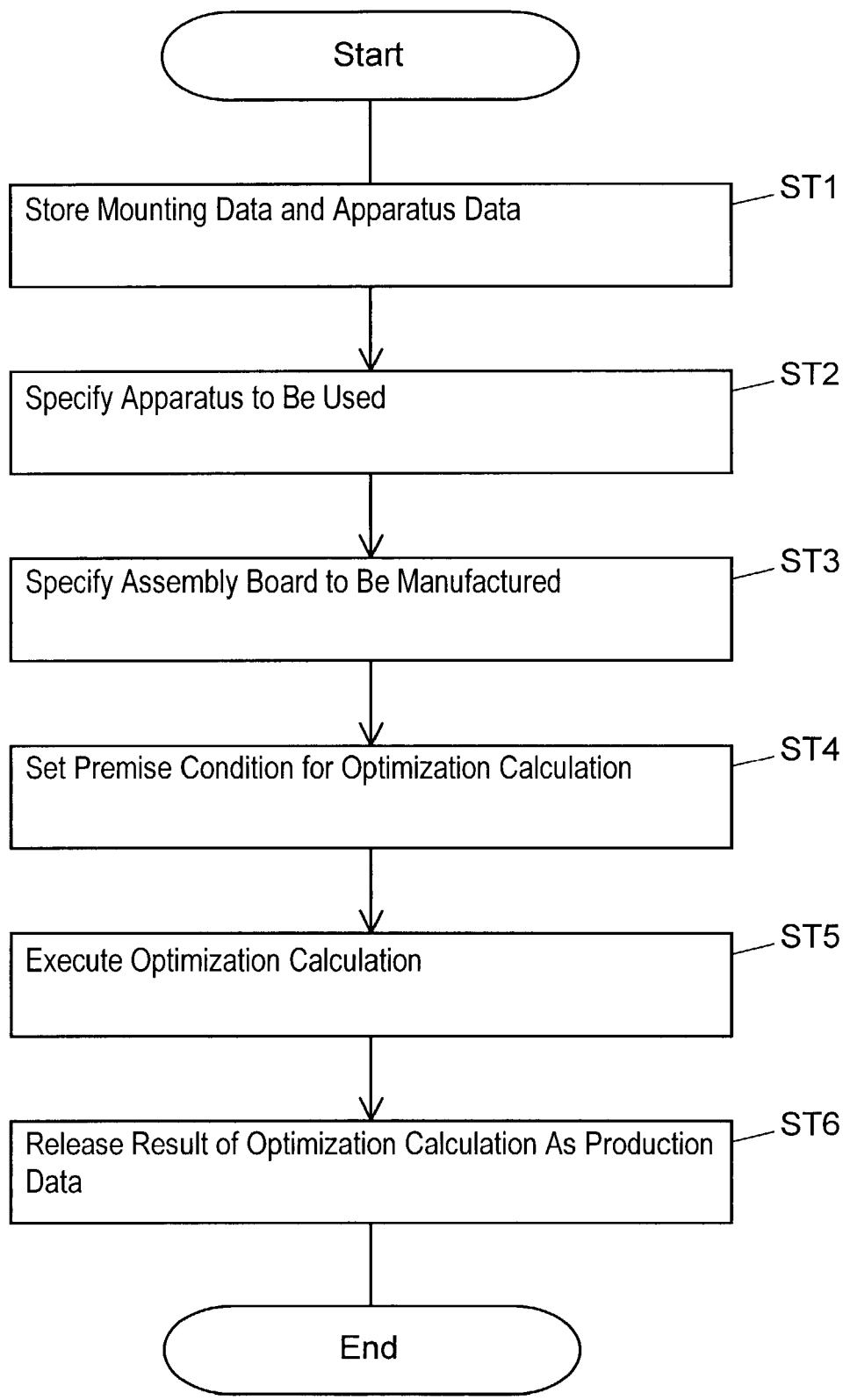
FIG. 5 is a flowchart for generating production data according to the embodiment.
Figure 6:
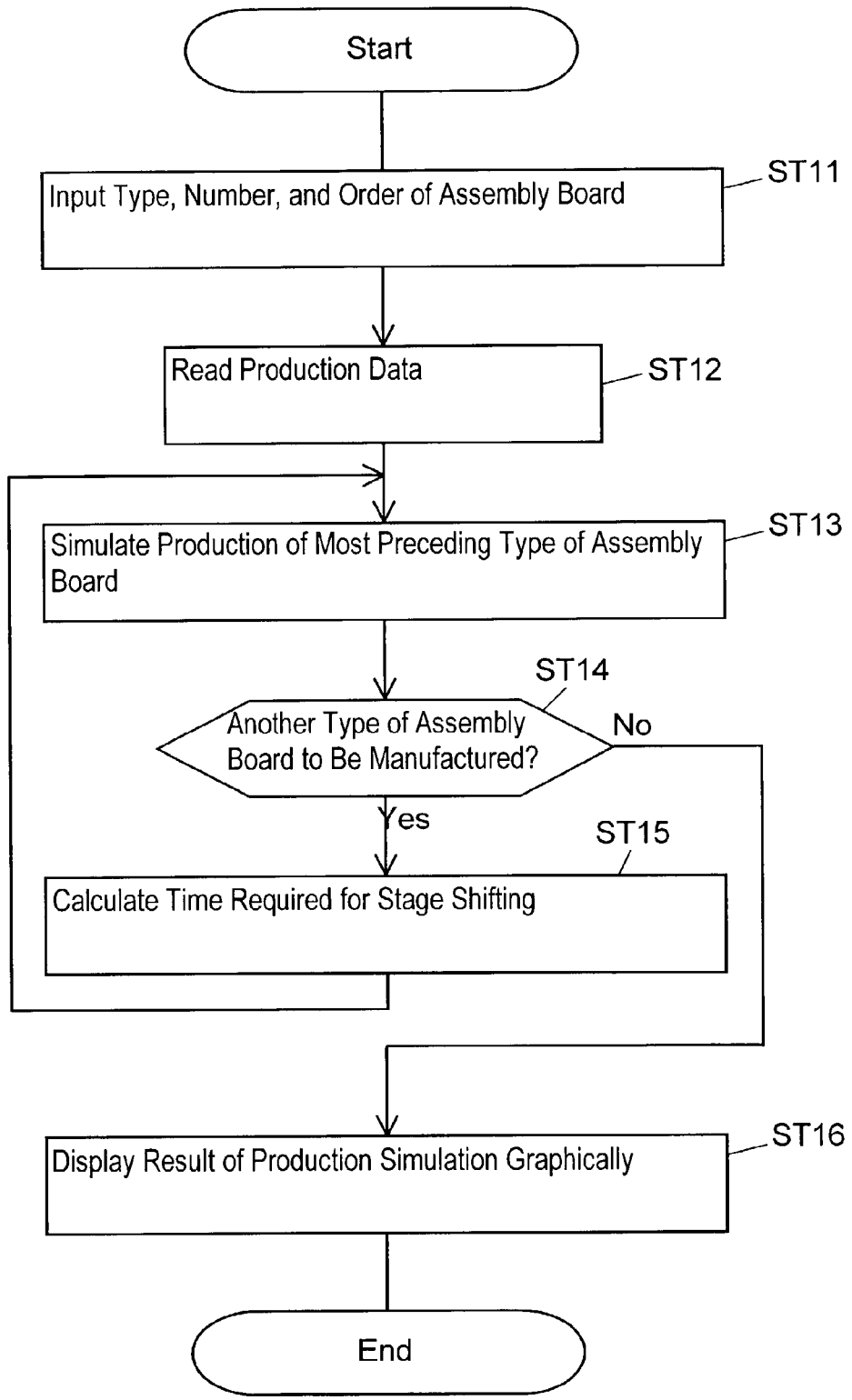
FIG. 6 is a flowchart for executing a production simulation according to the embodiment.

The production data generating process and the production simulation conducted by the production simulation apparatus 4 will be described in more detail referring to flowcharts of FIGS. 5 and 6. The mounting data about different types of the boards to be manufactured and the apparatus data about the electronic-component-mounting apparatuses are stored in the data storage unit 8 (ST1). An mounting apparatus involved is then determined for which of the mounting apparatuses handles a specific component (ST2). This allows the apparatus data 8b of the involved apparatuses to be read from the data storage unit 8. In case that only one model of the electronic-component-mounting apparatuses is used, the apparatus data is fixed. Then, the assembly boards to be manufactured is identified (ST3). The mounting data 8a of only the assembly boards to be manufactured is read out.

Then, the premise condition for optimization is set (ST4). As the premise, two aspects of the feeder arrangement data shown in FIG. 3 will be described.

In the first aspect, when different types of the assembly boards are to be manufactured, the feeders are relocated for manufacturing each type of the assembly board most efficiently. The relocation of the feeders for shifting the stage has to be repeated whenever the assembly board is switched from one type to another.

In the second aspect, necessary types of the component feeders 15 are located in the component feeding section 14 for manufacturing the different types of the assembly boards. This aspects permits the feeders in the component feeding section 14 to remain not relocated for mounting the components on the different types of the bare boards, hence allowing continuously-shifting production.

Then, the optimization data is calculated from the premise for manufacturing a desired type of the assembly boards (ST5). Since the feeder arrangement and the mounting sequence have been determined for making mounting efficiency local maximized under a given condition, the optimization data is released as the production data (ST6). The production data generating process is carried out for each of the types of the assembly boards, and the released production data 8c is stored in the data storage unit 8.

The flowchart for the production simulation will be explained referring to FIG. 6. First, information including the type of each assembly board, the number of products, and the order of the types to be manufactured are input (ST11). This specifies the type, number, and order of the assembly boards to be manufactured. Then, the production data for manufacturing each type of the assembly boards is read (ST12).

Then, the production simulation procedure is executed. First, the production simulation data of the most-preceding type of the assembly board is calculated (ST13). It is then examined whether another type of the assembly board is to be manufactured or not (ST14). If it is to be manufactured, the time required for the stage shifting is calculated (ST15). The step ST13 is repeated for all the types of the assembly boards to be manufactured in the order of production. When it is judged that no more type of the assembly board is to be manufactured (ST14), the result of the production simulation is graphically displayed on the display unit 11 (ST16).

Figure 7A:
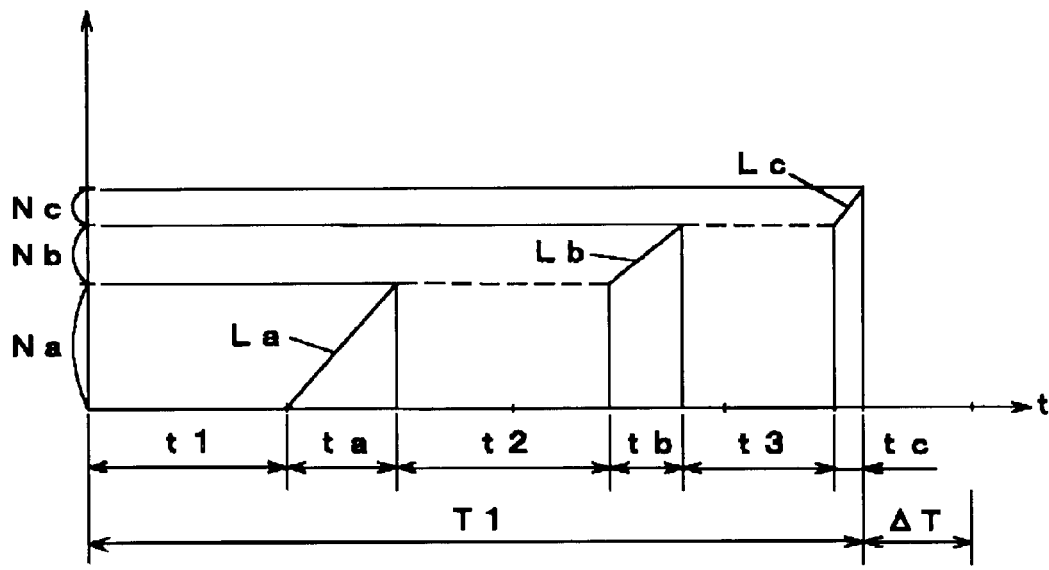
FIG. 7A and FIG. 7B are graphic diagrams showing a result of the production simulation according to the embodiment.
Figure 7B:
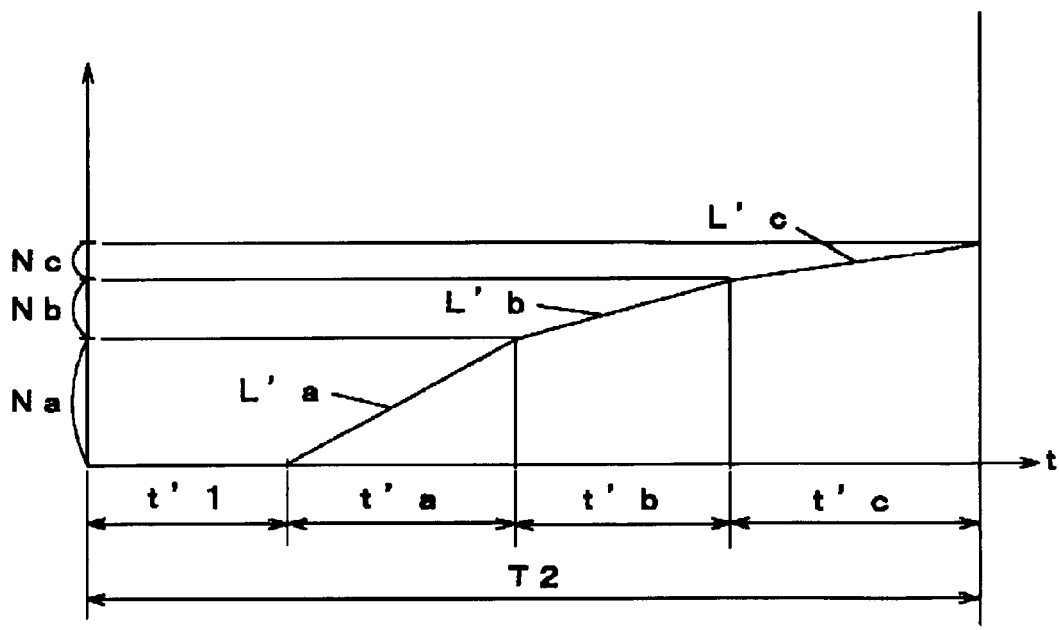

A result of the production simulation will be explained referring to FIG. 7A and FIG. 7B. FIG. 7A and FIG. 7B illustrate the production with time of a total number N of the assembly boards with one electronic-component-mounting apparatus consisting of Na, Nb, and Nc of the three (type a, type b, and type c) different assembly boards respectively. The simulation result shown in FIG. 7A is based on the first aspect of the premise for manufacturing the assembly boards of each type at the local maximum mounting efficiency. The simulation result shown in FIG. 7B is based on the second aspect of the premise where no stage shifting is needed.

The lines La, Lb, and Lc shown in FIG. 7A represent increase with time in the number of the assembly boards of the three types a, b, and c manufactured, and gradients of the lines express the efficiency of the mounting operation. In this case, the gradient of each line is acute since the efficiency is intended to maximum level. A time ta, a time tb, and a time tc for manufacturing the three types a, b, and c of the assembly boards, respectively. An initial stage time for manufacturing the type a is a time t1, while a time for stage shifting from the type a to the type b and a time from the type b to the type c is a time t2 and a time t3, respectively. The total production time is hence a time T1.

As shown in FIG. 7B, the lines L'a, L'b, and L'c represent increase with time in the number of the assembly boards of the types a, b, and c, respectively manufactured in the continuously-shifting mode. In this case, the feeder arrangement is fixed and the optimization of the mounting efficiency for each type of the assembly boards is not implemented. Accordingly, the gradient of each of the lines is relatively smaller than that shown in FIG. 7A. A time required for manufacturing the types a, b, and c of the assembly boards in this mode is hence a time t'a, a time t'b, and a time t+c, respectively which are longer than the time ta, the time tb, and the time tc of the previous mode, respectively. While an initial stage time is a time t'1, the shifting from the type a to type b or the shifting from the type b to type c requires no extra time. Accordingly, the total production time is a time T2.

In the aspects shown in FIG. 7A and FIG. 7B, a total production time in the aspect shown in FIG. 7A requiring the stage shifting process is shorter by ΔT than the continuously-shifting mode shown in FIG. 7B. However, the total production time of the latter mode may be shorter if requirements change. Either of the two modes can offer a higher production efficiency depending on the requirements. This is determined by the result of the production simulation of the embodiment.

For making a production plan, generally, various conditions other than fixed conditions are permitted. Therefore, a production planner is conventionally required to make efforts to optimize the conditions within a given range. This largely depends on experiments and skills of the planner.

Contrary to this, the production simulation apparatus of the embodiment allows the production simulation to be implemented under different conditions predetermined, and allows the result of the simulation to be displayed as a graphic diagram on the screen of the display unit. The plan, which has commonly been judged through experiments and feelings, can hence be evaluated logically.

The production simulation apparatus 4 described above is provided as a dedicated device separated from the host computer 3, but may function in the host computer 3.

What is claimed is:

1. A production simulation apparatus comprising:
   data storage means for storing mounting data about plural types of assembly boards and apparatus data about a component-mounting apparatus which includes: plural component feeders for feeding components; holders for holding said components; and a transfer head for picking up the components from the component feeders and mounting the components on bare boards, said apparatus data includes compatibility data which indicates compatibility between said feeders and said holders;
   production data generating means for generating, according to the mounting data and the apparatus data, production data for the transfer head to mount the components;
   command inputting means for inputting production command data including a production quantity of the assembly boards, a production order of the assembly boards to be manufactured, and for selecting between a first premise and a second premise, said first premise has location of one of said component feeders different for two of said assembly boards having a component of said one of said feeders in respectively different locations, said second premise has location of said one of said component feeders fixed for said two of said assembly boards, location of said one of said component feeders different or fixed depending upon said compatibility data for said feeder and ones of said holders;
   production simulating means for simulating a production based on the production data and the production command data to calculate a total number of the assembly boards manufactured with time by the component-mounting apparatus; and
   displaying means for displaying two different results of the simulation, depending upon whether said first premise or said second premise is selected.

2. A production simulation apparatus according to claim 1, wherein the production data includes:
   feeder arrangement data indicating an arrangement of the component feeders; and
   mounting sequence data indicating an order of the components picked up by the transfer head.

3. A production simulation apparatus according to claim 2, wherein the production data is generated from the mounting data and the apparatus data.

4. A production simulation apparatus according to claim 3, wherein the mounting sequence data corresponds to the arrangement of the component feeders.

5. A production simulation apparatus according to claim 1,
   wherein the mounting data includes coordinate data indicating a position where the components are mounted on the bare boards and component data indicating types of the components, and
   wherein the apparatus data includes data about the component feeders.

6. A method of simulating production, comprising the steps of:
   storing mounting data about plural types of assembly boards and apparatus data about a component-mounting apparatus which includes: plural component feeders for feeding components; holders for holding said components and a transfer head for picking up the components from the component feeders and mounting the components on bare boards, said apoaratus data includes compatibility data which indicates compatibility between said feeders and said holders;
   generating, according to the mounting data and the apparatus data, production data for the transfer head to mount the components;
   selecting between a first premise and a second premise, said first premise has location of one of said component feeders different for two of said assembly boards having a component of said one of said feeders in respectively different locations, said second premise has location of said one of said component feeders fixed for said two of said assembly boards, location of said one of said component feeders different or fixed depending upon said compatibility data for said feeder and ones of said holders;
   simulating a production based on the production data and production command data indicating a number of the assembly boards and a production order of the assembly boards to calculate a total number of the assembly boards manufactured with time by the component-mounting apparatus; and displaying different results of the simulation, depending upon whether said first premise or said second premise is selected.

7. A method according to claim 6, wherein the production data includes:
   feeder arrangement data indicating an arrangement of the component feeders; and
   mounting sequence data indicating an order of the components picked up by the transfer head.

8. A method according to claim 7,
   wherein the mounting data includes coordinate data indicating a position where the components are mounted on the bare boards and component data indicating types of the components, and
   wherein the apparatus data includes data about the component feeders.

9. A method of simulating components mounting, comprising the steps of:
   generating production data for determining an operation of a transfer head of a component-assembling apparatus to assemble plural assembly boards, each including one of bare boards and respective components mounted on the one of the bare boards, according to mounting data about the assembly boards and apparatus data about a component-assembling apparatus which includes the transfer head, plural component feeders for feeding components and holders for holding said components, said apparatus data includes compatibility data which indicates compatibility between said feeders and said holders;
   selecting between a first premise and a second premise, said first premise has location of one of said plural component feeders different for two of said assembly boards having a component of said one of said plural feeders in respectively different locations, said second premise has location of said one of said plural component feeders fixed for said two of said assembly boards, location of said one of said component feeders different or fixed depending upon said compatibility data for said one of said feeders and ones of said holders;
   executing a simulation to calculate a production efficiency of a component-mounting apparatus to mount the components on the one of the bare boards according to the production data and production command data indicating a respective production number and a production order of the assembly boards; and
   displaying different results of the simulation depending upon whether said first premise or said second premise is selected.

10. A method according to claim 9,
    wherein the mounting data includes coordinate data indicating respective positions where the components are mounted on the one of the bare boards and component data indicating types of the components,
    wherein the apparatus data includes data about component feeders storing the components, respectively, and
    wherein the production data includes:
    mounting sequence data indicating an order of the components picked up by the transfer head,
    feeder arrangement data indicating an arrangement of the component feeders.

* * * * *

UNITED STATES PATENT AND TRADEMARK OFFICE
CERTIFICATE OF CORRECTION

| | | |
|---|---|---|
| PATENT NO. | : 7,127,382 B2 | Page 1 of 1 |
| APPLICATION NO. | : 10/188531 | |
| DATED | : October 24, 2006 | |
| INVENTOR(S) | : Akihiko Kikuchi et al. | |

It is certified that error appears in the above-identified patent and that said Letters Patent is hereby corrected as shown below:

Column 8
Line 44, change "apoaratus" to -- apparatus --

Signed and Sealed this

Twenty-seventh Day of February, 2007

JON W. DUDAS
*Director of the United States Patent and Trademark Office*